US005612630A

United States Patent [19]
Wright et al.

[11] Patent Number: 5,612,630
[45] Date of Patent: Mar. 18, 1997

[54] ASYNCHRONOUS SELF-ADJUSTING INPUT CIRCUIT

[75] Inventors: Jeffrey P. Wright; Eugene H. Cloud, both of Boise, Id.

[73] Assignee: Micron Technology, Inc., Boise, Id.

[21] Appl. No.: 548,801

[22] Filed: Dec. 19, 1995

[51] Int. Cl.$^6$ ................................................ H03K 17/13
[52] U.S. Cl. .............................. 326/22; 326/31; 327/68
[58] Field of Search ........................... 326/21–22, 31; 327/68, 72, 73, 76

[56] References Cited

U.S. PATENT DOCUMENTS

| | | | |
|---|---|---|---|
| 4,958,088 | 9/1990 | Farah-bakhsh et al. | 307/443 |
| 5,034,623 | 7/1991 | McAdams | 307/290 |
| 5,278,460 | 1/1994 | Casper | 307/296 |
| 5,341,033 | 8/1994 | Koker | 327/206 |
| 5,347,177 | 9/1994 | Lipp | 307/443 |
| 5,361,002 | 11/1994 | Casper | 327/530 |
| 5,539,779 | 7/1996 | Nagahori | 327/73 X |

*Primary Examiner*—David R. Hudspeth
*Attorney, Agent, or Firm*—Schwegman, Lundberg, Woessner & Kluth, P.A.

[57] ABSTRACT

An asynchronous self-adjusting circuit includes an input circuit receiving an input signal and providing an output signal. The input circuit starts to switch the output signal to a first logic level based on the level of the input signal reaching a falling edge adjustable trip point, and starts to switch the output signal to a second logic level based on the level of the input signal reaching a rising edge adjustable trip point. A control circuit dynamically and asynchronously adjusts the falling and rising edge adjustable trip points as a function of a previous value of the input signal to permit the asynchronous self-adjusting circuit to respond quickly to changes in the input signal without causing oscillation of the output signal by asynchronously controlling when the output signal is permitted to again switch logic states once the output signal switches logic states.

22 Claims, 4 Drawing Sheets

ASYNCHRONOUS SELF-ADJUSTING INPUT CIRCUIT

FIELD OF THE INVENTION

The present invention relates generally to input circuits of integrated circuits, and more particularly to dynamically adjustable input buffers formed in a semiconductor integrated circuit such as in a complementary metal oxide semiconductor (CMOS) integrated circuit.

BACKGROUND OF THE INVENTION

Standard semiconductor integrated circuits operate based on a preset input logic high voltage level (VIH) and preset logic low voltage level (VIL). The VIH and VIL are typically determined by industry standards. For example, dynamic random access memory (DRAM) devices in complementary metal oxide semiconductor (CMOS) integrated circuits, such levels are typically 0.8 volts plus or minus 100 millivolts for VIL and 2.4 volts plus or minus 100 millivolts for VIH. Transistor-transistor logic trip points are typically 0.8 volts for VIL and 2 volts for VIH. Thus, in traditional non-adjusting trip point input buffers, as the input voltage (VIN) increases to 2 volts and higher, VIN is interpreted as a high logic level. As VIN decreases to 0.8 volts and lower VIN is interpreted as a low logic level. VIN is subject to self induced noise and noise from other lines via inductances, parasitic capacitances, and leakage currents. Trip points are typically set so they do not drift into the range where false highs or lows can be perceived.

For a variety of known reasons such as to reduce power consumption and prevent oscillation due to the input signal fluctuating between the logic high and logic low trip points, TTL level CMOS input buffers have been designed with hysteresis, such as the TTL level CMOS input buffer disclosed in the McAdams U.S. Pat. No. 5,034,623.

An input buffer disclosed in the Lipp U.S. Pat. No. 5,347,177 uses a system clock to determine when to synchronously and dynamically adjust the trip points of a CMOS input buffer to improve switching speed of the input buffer. In addition, this synchronous adjustment of the trip points reduces problems where the incident wave causes voltage overshooting resulting in a hazardous signal of a magnitude greater than the supply voltage. The Lipp input buffer reduces the input threshold voltage or trip point in the direction of the existing input voltage level. For example, when the input level is at a logic low, the input threshold voltage level is adjusted to below 50% of supply voltage for example 30% of supply voltage. Typically, prior fixed input buffers set the threshold voltage level at a nominal 50% of the supply voltage and in order to ensure switching only on a valid noise-immune signal in a conventional receiver, the signal level needs to be 70% of the supply voltage.

The Lipp input buffer operates by making the input threshold voltage level on the input buffer closer to the supply voltage level than to ground when a signal on a controlling lead is a logic low. Alternatively, when the signal on the controlling lead is at a logic high, the input threshold voltage of the input buffer is analogously lower to be closer to the ground voltage. The signal on the controlling lead has a logic state opposite to the input signal. The signal on the controlling lead is delayed by latches controlled by a system clock signal. After a logic state transition on the input signal, the signal on the controlling lead does not change its logic state until after the system clock signal cycles from a logic low to a logic high. This delay of the signal on the controlling lead allows the input signal to fully switch and stabilize before the input threshold voltage level is adjusted. Without this delay circuitry, the input buffer may oscillate.

There is, however, a need for an asynchronous dynamically adjustable input circuit that does not rely on a system clock to switch the trip points of the input circuit.

SUMMARY OF THE INVENTION

The present invention provides an asynchronous self-adjusting circuit including an input circuit to receive an input signal and to provide an output signal. The input circuit starts to switch the output signal to a first logic level based on the level of the input signal reaching a falling edge adjustable trip point. The input circuit starts to switch the output signal to a second logic level based on the level of the input signal reaching a rising edge adjustable trip point. A control circuit dynamically and asynchronously adjusts the falling and rising edge adjustable trip points as a function of a previous value of the input signal.

In one preferred embodiment of the present invention, the input circuit is an input buffer receiving an input signal into an integrated circuit. The input circuit is, however, alternatively embodied in an internal circuit of an integrated circuit.

The control circuit preferably includes a model circuit receiving the input signal for modelling the rising edge adjustable trip point on the falling edge of the input signal and for modelling the falling edge adjustable trip point on the rising edge of the input signal to dynamically and asynchronously adjust the falling and rising edge adjustable trip points. In one preferred embodiment of the present invention, the input circuit includes pairs of complimentary p-channel and n-channel transistors and the model circuit includes pairs of complimentary p-channel and n-channel transistors substantially similar to the pairs of complimentary p-channel and n-channel transistors of the input circuit.

In one preferred embodiment of the present invention, the input circuit includes an input inverter for switching an inverted signal to a high logic level based on the level of the input signal reaching the falling edge adjustable trip point and for switching the inverted signal to a low logic level based on the level of the input signal reaching the rising edge adjustable trip point. The output signal is a function of the inverted signal. For example, the output signal is alternatively the inverted signal itself or alternatively the output of another inverter which inverts the inverted signal so that the output signal corresponds to a non-inverted representation of the input signal. The possible logical relationships between the inverted signal and the output signal is not limited by the present invention.

In one preferred embodiment of the present invention the model circuit includes a model input inverter for switching a model inverted signal to a high logic level based on the level of the input signal reaching a model falling edge adjustable trip point and for switching the model inverted signal to a low logic level based on the level of the input signal reaching a model rising edge adjustable trip point. A model output inverter inverts the model inverted signal to provide a model output signal. The model inverted signal is provided to the input circuit for adjusting the falling and rising edge adjustable trip points. The model output signal is provided to the model input inverter for adjusting the model falling and rising edge adjustable trip points.

In an alternative embodiment of the present invention the control circuit includes a delay circuit receiving the inverted signal and providing a delayed inverted signal to the input inverter for adjusting the falling and rising edge adjustable trip points.

In any of the embodiments of the present invention, the asynchronous self-adjusting circuit quickly switches the logic state of an output signal based on changes in the input signal. The control circuit operates to asynchronously prevent the output signal of the asynchronous self-adjusting circuit from again switching logic states until appropriate to prevent oscillation by controlling the rising edge and falling edge adjustable trip points.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Like reference numerals are used for like elements throughout the Figures.

Figure 1:
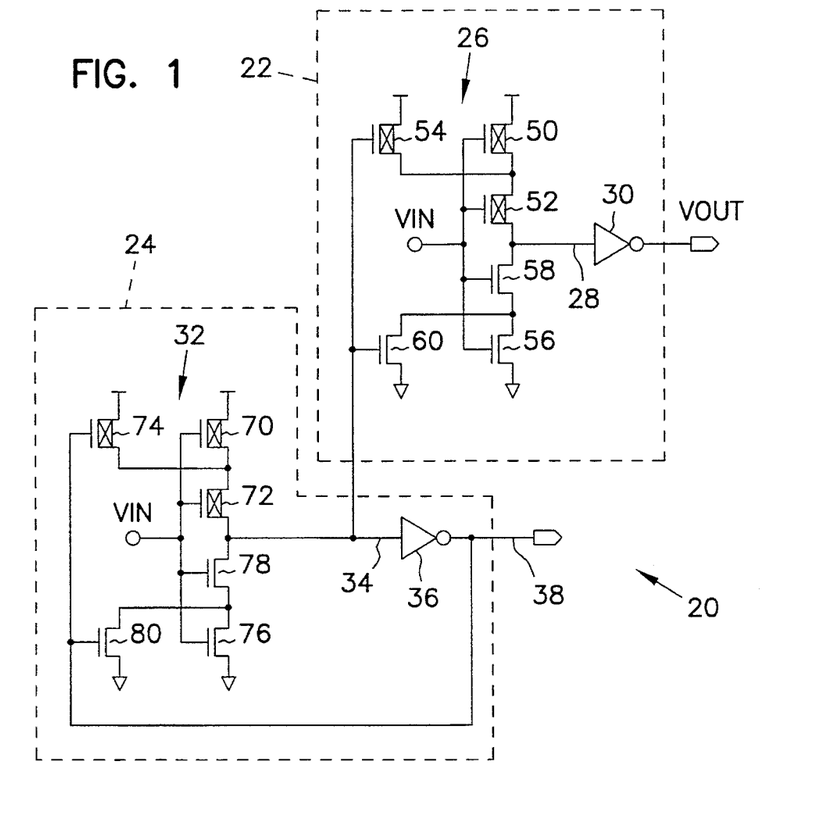
FIG. 1 is a schematic diagram of an asynchronous self-adjusting CMOS input circuit according to the present invention.

An asynchronous self-adjusting complimentary metal oxide semiconductor (CMOS) input circuit according to the present invention is illustrated generally at 20 in FIG. 1. Input circuit 20 includes an input buffer 22 which receives an input signal VIN and provides an output signal VOUT. Input buffer 22 includes an inverter 26 which receives the VIN signal and provides an inverted signal to a node 28 representing an inverted version of the VIN signal. The inverted signal on node 28 feeds a standard CMOS invertor indicated at 30. Invertor 30 is not critical to the invention and is shown for illustrative purposes only. Thus, any internal logical circuit element as dictated by known integrated circuit design choices can be substituted for the inverter 30. In the illustrated preferred embodiment of input circuit 20, inverter 30 receives the inverted signal on node 28 and inverts the signal to provide the VOUT signal which corresponds to a non-inverted version of the VIN signal. In other words, VOUT switches high in response to VIN switching high and switches low in response to VIN switching low.

Input inverter 26 operates based on a falling edge adjustable trip point and a rising edge adjustable trip point. Input inverter 26 starts switching the inverted signal on node 28 to a high logic level based upon the level of the VIN signal reaching the falling edge adjustable trip point and begin switching the inverted signal on node 28 to low logic level based on the level of the VIN signal reaching the rising edge adjustable trip point.

Input circuit 20 also includes a model circuit 24 which also receives input signal VIN and models inverter 26. The model circuit 24 effectively models the rising edge adjustable trip point on the falling edge of the VIN signal and models the falling edge adjustable trip point on the rising edge of the VIN signal to dynamically and asynchronously adjust the falling and rising edge adjustable trip points. In this way, model circuit 24 operates as a control circuit to dynamically and asynchronously adjust the falling and rising edge adjustable trip points as a function of a previous value of the VIN signal as received by model circuit 24.

Model circuit 24 includes an inverter 32 which receives the VIN signal and provides a model inverted signal on a node 34. As illustrated in FIG. 1 and as discussed in more detail below, input inverter 26 of input buffer 22 comprises pairs of complementary p-channel and n-channel transistors and inverter 32 of model circuit 24 comprises pairs of complementary p-channel and n-channel transistors substantially similar to the pairs of complementary p-channel and n-channel transistors of input inverter 26. Model circuit 24 also includes an inverter 36 which receives the model inverted signal on node 34 and provides a non-inverted model output signal on a line 38.

Model input inverter 32 operates by switching the model inverted signal on node 34 to a high logic level based on the level of the VIN signal reaching a model falling edge adjustable trip point and operates to switch the model inverted signal on node 34 to a low logic level based on the level of the VIN signal reaching a model rising edge adjustable trip point. The non-inverted model output signal on line 38 is provided back to model input inverter 32 for adjusting the model falling and rising edge adjustable trip points. The model inverted signal on node 34 is provided to the input inverter 26 for adjusting the falling and rising edge adjustable trip points of input inverter 26. The detailed operation and interaction of model circuit 24 and input inverter 26 is described below.

Inverter 26 of input buffer 22 comprises a p-channel transistor 50 with its source coupled to a supply voltage and its gate coupled to the VIN signal. A p-channel transistor 52 has its source coupled to the drain of p-channel transistor 50 and its gate coupled to the VIN signal. A p-channel transistor 54 has its source coupled to the supply voltage and its drain coupled to the drain of p-channel transistor 50 and the source of p-channel transistor 52.

Inverter 26 also comprises a n-channel transistor 56 with its source coupled to a ground or other suitable reference potential and its gate coupled to the VIN signal. A n-channel transistor 58 has its source coupled to the drain of n-channel transistor 56 and its gate coupled to VIN. A n-channel transistor 60 has its source coupled to ground and its drain coupled to the drain of n-channel transistor 56 and the source of n-channel transistor 58. The drains of n-channel transistor 58 and p-channel transistor 52 are coupled to node 28 to produce the inverted signal on node 28.

As mentioned above, the pairs of p-channel and n-channel transistors of inverter 32 of model circuit 24 are substantially similar to the pairs of p-channel and n-channel transistors of input inverter 26 of input buffer 22. Accordingly, inverter 32 of model circuit 24 comprises a p-channel transistor 70 with its source coupled to the supply voltage and its gate coupled to the VIN signal. A p-channel transistor 72 has its source coupled to the drain of p-channel transistor 70 and its gate coupled to the VIN signal. A p-channel transistor 74 has its source coupled to the supply voltage and its drain coupled to the drain of p-channel transistor 70 and the source of p-channel transistor 72.

Inverter 32 also comprises an n-channel transistor 76 with its source coupled to the ground or other suitable reference potential and its gate coupled to the VIN signal. An n-channel transistor 78 has its source coupled to the drain of n-channel transistor 76 and its gate coupled to VIN. An n-channel transistor 80 has its source coupled to ground and its drain coupled to the drain of n-channel transistor 76 and the source of n-channel transistor 78. The drains of n-channel transistor 78 and p-channel transistor 72 are coupled to node 34 to produce the inverted signal on node 34. The model inverter signal on node 34 is coupled to the gates of p-channel transistor 54 and n-channel 60 of inverter 26. The non-inverted model output signal on line 38 is coupled to the gates of p-channel transistor 74 and n-channel transistor 80.

Figure 2:
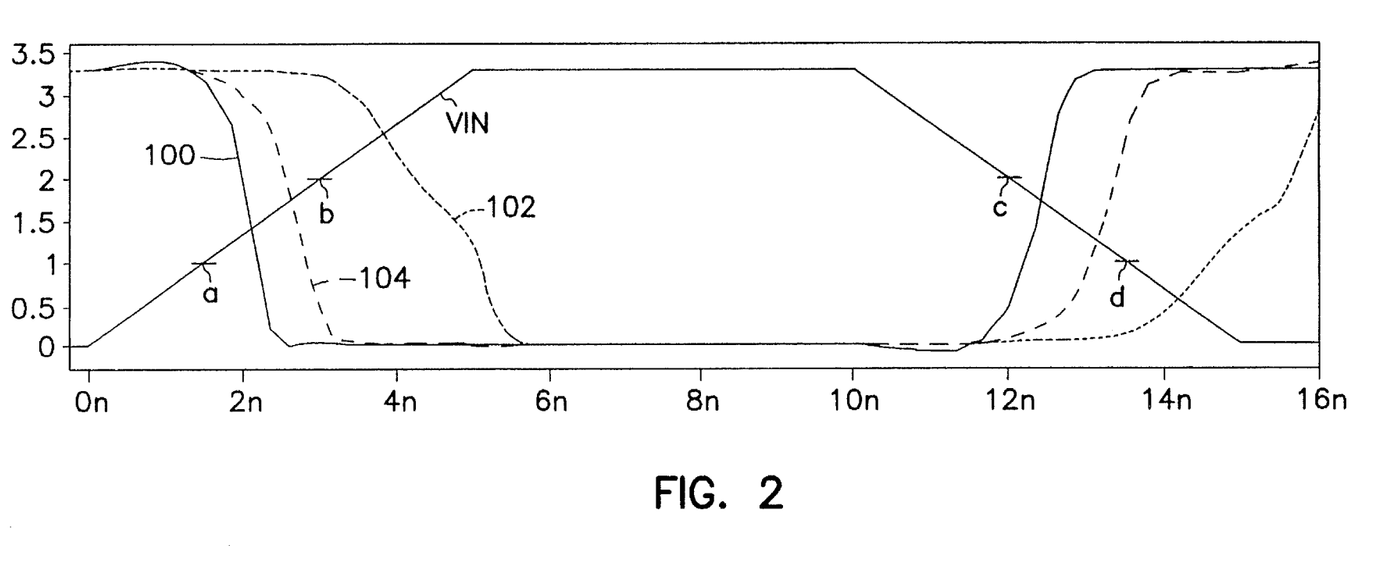
FIG. 2 is an HSPICE timing diagram illustrating the operation of the asynchronous self-adjusting CMOS input circuit of FIG. 1.

The operation of input circuit 20 is illustrated in timing diagram form in FIG. 2, which indicates volts vertically and nanoseconds horizontally. FIG. 2 represents the response of an HSPICE model of input circuit 20 to the VIN signal as indicated by the inverted signal at node 28 and the model inverted signal at node 34. TABLE I below shows an example of suitable values for aspect ratios, representative of the width over the length of the given transistor channel, for the transistors illustrated in FIG. 1. The aspect ratio values shown in TABLE I are used in the HSPICE model illustrated in timing diagram form in FIG. 2. These aspect ratios can of course be varied based on known design choices.

TABLE I

| Transistors | Aspect Ratio |
| --- | --- |
| P-Channel Transistors 50 and 70 | 7.5/1.2 |
| P-Channel Transistors 52, 54, 72, and 74 | 160/1.2 |
| N-Channel Transistors 56 and 76 | 5/1.2 |
| N-Channel Transistors 58, 60, 78, and 80 | 80/1.2 |

As illustrated in FIG. 2, a waveform VIN illustrates input signal VIN. Input inverter 26's response to the VIN signal is illustrated by a waveform 100 to represent the switching of the inverted signal at node 28. Model inverter 32's response to the VIN signal is illustrated by a waveform 102 to represent the switching of the model inverted signal at node 34. A waveform 104 illustrates a typical output waveform of an inverter of a traditional non-adjusting trip point buffer in response to the VIN signal to provide a comparison of waveforms 100 and 102 of the input circuit 20 of the present invention to the response of a traditional non-adjusting trip point input buffer. The traditional non-adjusting input buffer waveform 104 illustrates non-adjustable rising edge and falling edge trip points between the adjustable trip points illustrated by waveforms 100 and 102.

As illustrated in FIG. 2, from prior to the time indicated at 0 nanoseconds to the time corresponding to the trip point indicated at point a, the VIN signal is interpreted as a low logic level. Thus, p-channel transistors 50, 52, 70, and 72 are turned on while n-channel transistors 56, 58, 76, and 78 are turned off with the VIN signal applied to their respective gates. Up to point a, the value of the signals on lines 28 and 34 represented respectively by waveforms 100 and 102 are high logic levels. P-channel transistor 54 is turned off and n-channel transistor 60 is turned on with the high logic level of the model inverted signal on node 34 applied to their respective gates. The high logic level of the model inverted signal on node 34 is inverted by inverter 36 which provides a low logic level from line 38 to the gates of p-channel transistor 74 and n-channel transistor 80 to thereby turn on p-channel transistor 74 and turn off n-channel transistor 80.

At the rising edge adjustable trip point of input inverter 26 indicated at point a (approximately 1 volt as illustrated), p-channel transistors 50, 52, 70, 72, and n-channel transistors 56, 58, 76 and 78 are all turned on. This is because in the range of voltage of VIN from approximately at 1 volt, at point a, to approximately 2 volts, at point b, the p-channel transistors 50, 52, 70, 72 interpret the VIN signal as a logic low and the n-channel transistors 56, 58, 76 and 78 interpret the VIN signal as a logic high. Therefore, in this 1 to 2 volt range, the respective states of p-channel transistor 54 and n-channel transistor 60 of input inverter 26 control which logic level is to be applied to node 28. Similarly, the respective states of p-channel transistor 74 and n-channel transistor 80 of model inverter 32 control which logic level is to be applied to node 34.

Prior to the time corresponding to point a, p-channel transistor 74 is on and n-channel transistor 80 is off. Thus, from point a to point b (approximately 1 volt to 2 volts), node 34 is pulled to the supply voltage, and therefore, remains at a high logic level as shown by waveform 102. With node 34 at a high logic level, p-channel transistor 54 remains off and n-channel transistor 60 remains on from point a to point b. Thus, from point a to point b, node 28 is pulled toward the ground level, or in other words, is transitioned to a low logic level as shown by the drop in waveform 100.

Point b represents the model rising edge adjustable trip point or approximately 2 volts as illustrated. After the VIN signal reaches point b, p-channel transistors 50, 52, 70, 72 interpret VIN as a high logic level to turn these transistors off, and n-channel transistors 56, 58, 76, and 78 continue to interpret VIN as a high logic level so these transistors remain on. Thus, from point b to point c, the controlling transistors 54 and 60 of input inverter 26 and the controlling transistors 74 and 80 of model inverter 32 no longer control the state of the outputs of the inverters. With n-channel transistors 56 and 58 on and p-channel transistors 50 and 52 off, node 28 as represented by waveform 100 remains at a low logic level. With n-channel transistors 76 and 78 on and p-channel transistors 70 and 72 off, node 34 is transitioned to a low logic level as indicated by the drop to the low logic level in waveform 102.

Between points b and c, after the model inverted signal at node 34 transitions to a low logic level, p-channel transistor 54 is turned on and n-channel transistor 60 is turned off. Inverter 36 inverts the low logic level at node 34 to produce a high logic level at node 38 which turns p-channel transistor off and n-channel transistor 80 on. Although controlling transistors 54 and 60 of input inverter 26 and controlling transistors 74 and 80 of model inverter 32 do not effect the output of the inverters between points b and c, the state of controlling transistors 54 and 60 and controlling transistors 74 and 80 prior to point c control the respective outputs of inverters 26 and 32 between points c and d.

Point c represents the falling edge adjustable trip point of input inverter 26 or approximately 2 volts. In the range of voltage of VIN from approximately at 2 volts, at point c, to approximately 1 volt, at point d, the p-channel transistors 50, 52, 70, 72 interpret the VIN signal as a low logic level and the n-channel transistors 56, 58, 76 and 78 interpret the VIN signal as a high logic level. Thus, between points c and d, with a low logic level on their gates, p-channel transistors 50, 52, 70, 72 are on, and with a high logic level on their gates, n-channel transistors 56, 58, 76, and 78 are also on. Prior to point c, p-channel transistor 74 is off and n-channel transistor 80 is on which results in node 34 being pulled towards ground, and therefore, node 34 remains at a low logic level as shown by waveform 102. With node 34 remaining at a low logic level, p-channel transistor 54 remains on and n-channel transistor 60 remains off which pulls node 28 towards to the supply voltage, and therefore, node 28 transitions to a high logic level as shown by the rise in waveform 100.

Point d represents the model falling edge adjustable trip point of model inverter 32. When the VIN signal reaches point d, p-channel transistors 50, 52, 70, 72 continue to interpret VIN as a low logic level and thereby remain on. N-channel transistors 56, 58, 76, and 78 interpret the values from point d (approximately one volt) and below as low logic levels and are thereby turned off. From point d to the next point a, controlling transistors 54 and 60 no longer control the output state of inverter 26 at node 28, and controlling transistors 74 and 80 no longer control the output state of inverter 32 at node 34. Thus, as indicated by waveform 100, the state at node 28 remains a high logic level. In addition, as indicated by waveform 102, the state of node 34 transitions to a high logic level.

As can be seen by the comparison of waveform 100 representing the output of the asynchronous self-adjusting input circuit according to the present invention as compared to waveform 104 of an output of a traditional non-adjusting trip point input butter, input buffer 22 of the input circuit 20 according to the present invention transitions much faster than the traditional non-adjusting input buffer on both the rising edge and the falling edge of the VIN signal. Unlike the synchronous dynamically adjustable input buffer described in the Lipp U.S. Pat. No. 5,347,177 discussed in the background section, input circuit 20 according to the present invention, asynchronously determines when the trip points are to be adjusted. In other words, input circuit 20 does not rely on a system clock signal to determine when it can again switch the logic state of the VOUT signal after a given logic state switch of the VOUT signal. Thus, the input circuit 20 according to the present invention responds quickly to changes in the VIN signal without causing oscillation of the VOUT signal by asynchronously controlling when the VOUT signal is permitted to again switch logic states once the VOUT signal switches logic states.

Essentially input inverter 26 is allowed to trip quickly (i.e., at point a at approximately 1 volt on the rising edge of VIN and at point c at approximately 2 volts on the falling edge of VIN as illustrated) because model circuit 24 makes certain that inverter 26 does not trip between points a and b on the rising edge of the VIN signal and points c and d on the falling edge of the VIN signal. This is because while input inverter 26 is made to have fast trip point, inverter 32 of model circuit 24 maintains more typical trip points of a typical hysteresis input buffer (i.e., at point b at approximately 2 volts on the rising edge of VIN and at point d at approximately 1 volt on the falling edge of VIN as illustrated). Because model circuit 24 controls the trip points of input inverter 26 from points a to b and from points c to d, the output of inverter 26 is prevented from again transitioning after the fast trip point at point a or c until inverter 32 reaches its slower trip point at point b or d respectively. In this way, oscillation is prevented, yet the VOUT signal from input circuit 20 is allowed to transition between logic levels much earlier than conventional non-adjusting trip point input buffers.

The present invention is in not limited to an input circuit with the above described arrangement of transistors as illustrated in FIG. 1, as there are numerous suitable arrangements according to the present invention which permit dynamic and asynchronous adjustment of the falling and rising edge adjustable trip points of an input buffer such as input inverter 26. For example, p-channel transistor 50 of inverter 26 and p-channel transistor 70 of model inverter 32 could alternatively have their drains coupled directly to node 28 and node 34 respectively. Similarly, n-channel transistor 56 of inverter 26 and n-channel transistor 76 of model inverter 32 could alternatively have their drains coupled directly to node 28 and node 34 respectively.

The present invention is not limited to an asynchronous self-adjusting input circuit including an input buffer, such as input buffer 22 illustrated in FIG. 1. For example, the present invention is alternatively embodied in an asynchronous self-adjusting circuit comprising an input circuit internal to an integrated circuit receiving an input signal and providing an output signal, where the falling and rising edge adjustable trip points of the internal input circuit are adjusted by a model or other control circuit as a function of a previous value of the input signal.

The preferred embodiment of input circuit 20 described above includes model circuit 24 to control the dynamic and asynchronous adjustment of the falling and rising edge adjustable trip points of input inverter 26 as a function of a previous value of input signal VIN. The present invention is not limited to a model circuit such as model circuit 24. For example, an alternative embodiment of an input circuit according to the present invention is illustrated generally at 90 in FIG. 3. Input circuit 90 includes an input buffer 22 comprising inverter 26 and inverter 30 substantially similar to the input buffer 22 comprising inverter 26 and inverter 30 of input circuit 20. Therefore, like reference numerals are used for like elements and only the differences in connection between these elements in input circuit 90 as compared to input circuit 20 are described herein.

Figure 3:
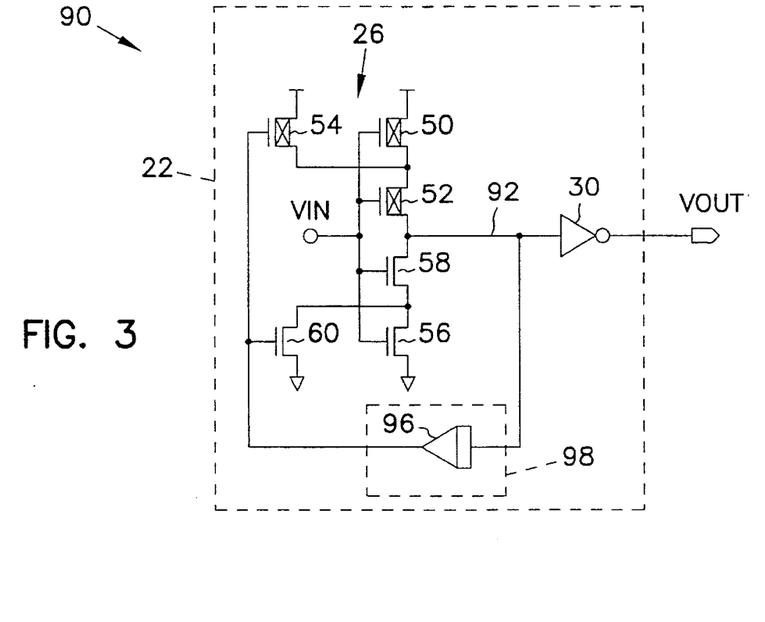
FIG. 3 is an alternative embodiment of an asynchronous self-adjusting CMOS input circuit according to the present invention.

Inverter 26 of input circuit 90 receives the VIN signal and provides an inverted signal at a node 92 representing an inverted version of the VIN signal. Node 92 is coupled to the drains of p-channel transistor 52 and n-channel transistor 58. Inverter 30 receives the inverted signal at node 92 and inverts the signal to provide the VOUT signal which corresponds to a non-inverted version of the VIN signal. As with input circuit 20, inverter 30 of input circuit 90 is a standard CMOS invertor shown for illustrative purposes only and is not critical to the invention. Thus, any internal logical circuit element as dictated by known integrated circuit design choices can be substituted for the inverter 30. The inverted signal at node 92 is fed to the input of a delay circuit 96. The output of delay circuit 96 is fed to the gates of p-channel transistor 54 and n-channel transistor 60 to control the falling and rising edge adjustable trip points of inverter 26. Delay circuit 96 provides a preset delay such as, for example, a three nanosecond delay.

In input circuit 90, with the VIN signal at a clear low logic level p-channel transistors 50 and 52 are on and n-channel transistors 56 and 58 are off. In this case, node 92 is brought towards the supply voltage, and is therefore, at a high logic level. The high logic level at node 92 is provided through delay element 96 to the gates of p-channel transistor 54 and n-channel transistor 60 to cause p-channel transistor 54 to be turned off and n-channel transistor 60 to be turned on.

Thus, when the VIN signal transitions from a low logic level to the rising edge adjustable trip point of inverter 26, such as at point a or approximately 1 volt as illustrated in FIG. 2, p-channel transistors 50 and 52 remain on as they continue to interpret VIN as a low logic level and n-channel transistors 56 and 58 are turned on as they interpret VIN as a transition to a high logic level. In this case, similar to as described above in reference to input circuit 20, transistors 54 and 60 control the state of output node 92.

As mentioned above, prior to the VIN signal reaching the rising edge adjustable trip point of inverter 26 to turn on n-channel transistors 56 and 58, the high level from node 92 is provided to the gates of p-channel transistor 54 and n-channel transistor 60 to cause p-channel transistor 54 to be off and n-channel transistor 60 to be on. In this way, delay element 96 delays any change on output 92 from being received by controlling transistors 54 and 60 by the preset delay of delay circuit 96. Thus, when n-channel transistors 56 and 58 turn on and with p-channel transistor 54 off and n-channel transistor 60 on, node 92 is pulled toward the ground or other reference voltage, or in other words, begins to transition to a low logic level. After being delayed by the preset delay of delay circuit 96 (e.g., three nanoseconds), the transition of node 92 to the low logic level is provided to the gates of p-channel transistor 54 and n-channel transistor 60 to turn on p-channel transistor 54 and turn off n-channel transistor 60. At this point, if p-channel transistors 50 and 52 and n-channel transistors 56 and 58 are all on as a result of the VIN signal being between approximately 1 to 2 volts, node 92 would then transition to a high logic level or towards a high voltage. The delay element 96 acts to prevent this type of transition to a high logic level prior to a sufficient delay to thereby prevent oscillation once a transition to a low logic level on node 92 has been made on the rising edge of the VIN signal. Therefore, as indicated at 98, delay circuit 96 functions as a control circuit according to the present invention which dynamically and asynchronously adjusts the falling and rising edge adjustable trip points as a function of a previous value of the VIN input signal.

The operation of delay circuit 96 to control the falling edge adjustable trip point of inverter 26 is similar to the above described operation of delay circuit 96 to control the rising edge adjustable trip point of inverter 26. Prior to reaching the falling edge adjustable trip point p-channel transistor 54 is on and n-channel transistor 60 is off. Therefore, when the falling edge adjustable trip point is reached, at approximately 2 volts as illustrated, p-channel transistors 50 and 52 are turned on and n-channel transistors 56 and 58 remain on. At this point, with p-channel transistor 54 on and n-channel transistor 60 off, node 92 begins to transition to a high logic level by being pulled to the supply voltage. Once this high logic level is received by the gates of p-channel transistor 54 and n-channel transistor 60 after having been delayed by the preset delay of delay circuit 96, p-channel transistor 54 is turned off and n-channel transistor 60 is turned on so that if all of transistors 50, 52, 56 and 58 are on, node 92 would be brought to a low logic level. However, similar to on the rising edge of the VIN signal, node 92 is prevented from being transitioned to a low logic level on the falling edge of VIN once the node has transitioned to a high logic level until after the appropriate delay provided by delay element 96.

Referring to FIG. 2, the time between points a and b and the time between points c and d is approximately two nanoseconds as illustrated. Thus, for the transistor sizes illustrated by the HSPICE timing diagram of FIG. 2, the preset delay of delay circuit 96 needs to be at least two nanoseconds so as to ensure that input inverter 26 does not improperly transition to a high logic level after the rising edge trip point or to a low logic level after the falling edge trip point to cause inverter 26 to go into oscillation. Thus, a proper preset delay for delay circuit 96 is, for example, 3 nanoseconds to account for wide variations in rise times and fall times of the VIN signal, variations in parameters of circuit elements of in input circuit 90, and variations in power supply voltages. In this sense, input circuit 20, which utilizes model circuit 24 as the control circuit to dynamically and asynchronously adjust the falling and rising edge adjustable trip points of input inverter 26, is the preferred form of the present invention, as input circuit 20 does not rely on a preset delay after the input inverter is tripped. Nevertheless the alternative embodiment illustrated by input circuit 90, provides illustration to one skilled in the art that there is a wide variation in possible circuitry for the control circuit according to the present invention which dynamically and asynchronously adjusts the falling and rising edge adjustable trip points as a function of a previous value of the VIN input signal.

Figure 4:
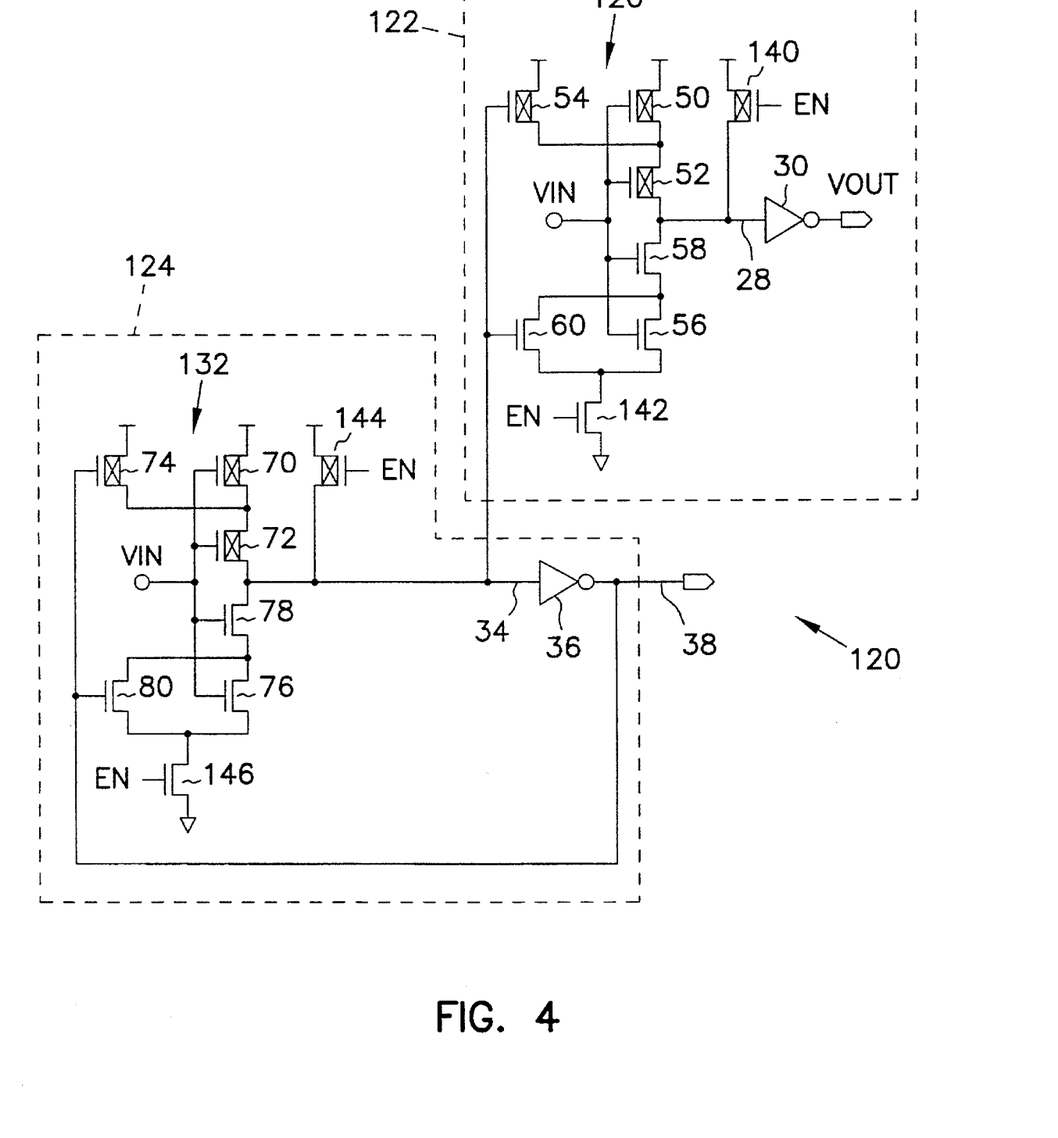
FIG. 4 is an embodiment of an asynchronous self-adjusting CMOS input circuit according to the present invention with enabling circuitry.

An embodiment of an input circuit with enabling circuitry according to the present invention is illustrated generally at 120 in FIG. 4. Input circuit 120 includes an input buffer 122 comprising an inverter 126 and inverter 30 substantially similar to the input buffer 22 comprising inverter 26 and inverter 30 of input circuit 20, except that input buffer 122 includes enabling circuitry comprising p-channel transistor 140 and n-channel transistor 142. Correspondingly, input circuit 120 includes a model circuit 124 comprising an inverter 132 and inverter 36 substantially similar to the model circuit 24 comprising inverter 32 and inverter 36 of input circuit 20, except that model circuit 124 comprises enabling circuitry comprising p-channel transistor 144 and n-channel transistor 146. Therefore, like reference numerals are used for like elements and only the enabling circuit portions of input circuit 120 are described herein.

P-channel transistor 140 has its source coupled to the supply voltage, its drain coupled to node 28, and its gate coupled to an enable (EN) signal. N-channel transistor 142 has its source coupled to ground, its drain coupled to the sources of n-channel transistors 56 and 60, and its gate coupled to the EN signal. P-channel transistor 144 has its source coupled to the supply voltage, its drain coupled to node 34, and its gate coupled to the EN signal. N-channel transistor 146 has its source coupled to ground, its drain coupled to the sources of n-channel transistors 76 and 80, and its gate coupled to the EN signal.

The enabling circuitry of input circuit 120 operates in a known manner such that with the EN signal at a low logic level, p-channel transistors 140 and 144 are turned on to effectively connect the supply voltage to nodes 28 and 34. In addition, with the EN signal at a low logic level, n-channel transistors 142 and 146 are turned off to effectively disconnect ground from the sources of n-channel transistors 56, 60, 76, and 80. Thus, with the EN signal low, nodes 28 and 34 are respectively forced toward the supply voltage or a high logic level. With the EN signal at a high logic level, n-channel transistors 142 and 146 are turned on to effectively connect ground to the sources of n-channel transistors 56, 60, 76, and 80. In addition, with the EN signal at a high logic level, p-channel transistors 140 and 144 are turned off. Thus, with the EN signal high, input circuit 120 is enabled to operate substantially similar to the above described operation of input circuit 20 of FIG. 1.

Figure 5:
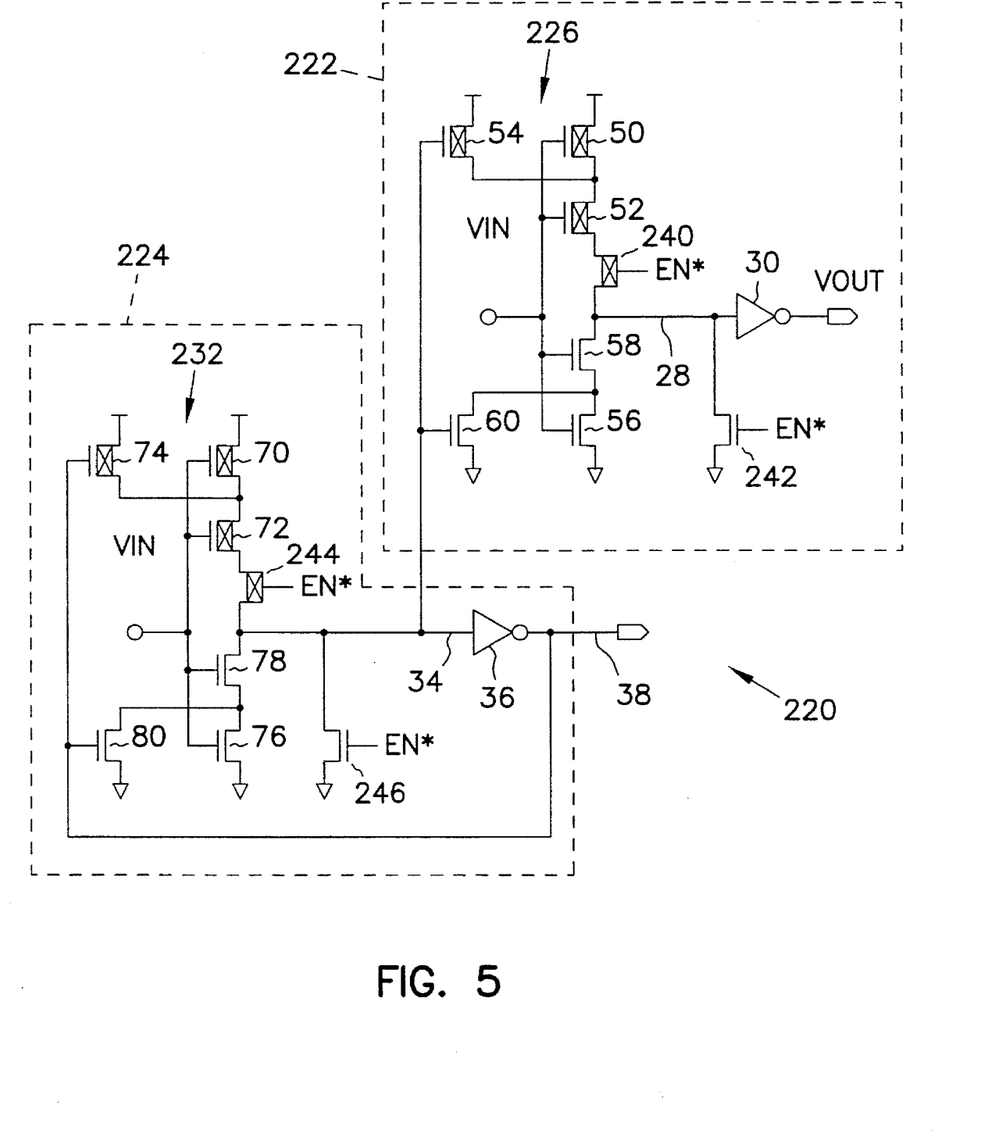
FIG. 5 is an alternative embodiment of an asynchronous self-adjusting CMOS input circuit according to the present invention with enabling circuitry.

An alternative embodiment of an input circuit with enabling circuitry according to the present invention is illustrated generally at 220 in FIG. 5. Input circuit 220 includes an input buffer 222 comprising an inverter 226 and inverter 30 substantially similar to the input buffer 22 comprising inverter 26 and inverter 30 of input circuit 20, except that input buffer 222 includes enabling circuitry comprising p-channel transistor 240 and n-channel transistor 242. Correspondingly, input circuit 220 includes a model circuit 224 comprising an inverter 232 and inverter 36 substantially similar to the model circuit 24 comprising inverter 32 and inverter 36 of input circuit 20, except that model circuit 224 comprises enabling circuitry comprising p-channel transistor 244 and n-channel transistor 246. Therefore, like reference numerals are used for like elements and only the enabling circuit portions of input circuit 220 are described herein.

P-channel transistor 240 has its source coupled to the drain of p-channel transistor 52, its drain coupled to node 28, and its gate coupled to an enable* (EN*) signal. N-channel transistor 242 has its source coupled to ground, its drain coupled to node 28, and its gate coupled to the EN* signal. P-channel transistor 244 has its source coupled to the drain of p-channel transistor 72, its drain coupled to node 34, and its gate coupled to the EN* signal. N-channel transistor 246 has its source coupled to ground, its drain coupled to node 34, and its gate coupled to the EN* signal.

The enabling circuitry of input circuit 220 operates in a known manner such that with the EN* signal at a high logic level, p-channel transistors 240 and 244 are turned off to effectively disconnect the drains of p-channel transistors 52 and 72 from nodes 28 and 34 respectively. In addition, with the EN* signal at a high logic level, n-channel transistors 242 and 246 are turned on to effectively connect nodes 28 and 34 respectively to ground. Thus, with the EN* signal high, nodes 28 and 34 are respectively forced toward ground or a low logic level. With the EN* signal at a low logic level, n-channel transistors 242 and 244 are turned off. In addition, with the EN* signal at a low logic level, p-channel transistors 240 and 244 are turned on to effectively connect the drains of p-channel transistors 52 and 72 to nodes 28 and 34 respectively. Thus, with the EN* signal low, input circuit 220 is enabled to operate substantially similar to the above described operation of input circuit 20 of FIG. 1.

It should be noted that in many field effect transistors, the source and drain are essentially interchangeable, and interconnections specified herein should not be interpreted as solely limited to those described. In addition, certain transistors were described as n-channel or p-channel transistors. It is recognized by those skilled in the art that such transistors may be switched on essentially a wholesale basis so that those described as p-channel become n-channel and those described as n-channel become p-channel transistors without departing from scope and spirit of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An asynchronous self-adjusting circuit comprising:

an input circuit receiving an input signal and providing an output signal, wherein the input circuit starts to switch the output signal to a first logic level based on the level of the input signal reaching a falling edge adjustable trip point and wherein the input circuit starts to switch the output signal to a second logic level based on the level of the input signal reaching a rising edge adjustable trip point; and a control circuit to dynamically and asynchronously adjust the falling and rising edge adjustable trip points as a function of a previous value of the input signal.

2. The asynchronous self adjusting circuit of claim 1 wherein the control circuit comprises a model circuit receiving the input signal for modelling the rising edge adjustable trip point on the falling edge of the input signal and for modelling the falling edge adjustable trip point on the rising edge of the input signal to dynamically and asynchronously adjust the falling and rising edge adjustable trip points.

3. The asynchronous self-adjusting circuit of claim 2 wherein the input circuit includes pairs of complimentary p-channel and n-channel transistors and the model circuit includes pairs of complimentary p-channel and n-channel transistors substantially similar to the pairs of complimentary p-channel and n-channel transistors of the input circuit.

4. The asynchronous self-adjusting circuit of claim 1 wherein the input circuit comprises:

an input inverter for switching an inverted signal to a high logic level based on the level of the input signal reaching the falling edge adjustable trip point and for switching the inverted signal to a low logic level based on the level of the input signal reaching the rising edge adjustable trip point, and wherein the output signal is a function of the inverted signal.

5. The asynchronous self-adjusting circuit of claim 4 wherein the control circuit comprises:

a delay circuit receiving the inverted signal and providing a delayed inverted signal to the input inverter for adjusting the falling and rising edge adjustable trip points.

6. The asynchronous self-adjusting circuit of claim 1 wherein the input circuit comprises:

enabling circuitry receiving an enable signal for forcing the output signal to a defined logic state based on the enable signal being at a selected disable state.

7. The asynchronous self-adjusting circuit of claim 1 wherein the input circuit includes an input buffer.

8. An asynchronous self-adjusting circuit comprising:

an input circuit receiving an input signal and providing an output signal, wherein the input circuit starts to switch the output signal to a first logic level based on the level of the input signal reaching a falling edge adjustable trip point and wherein the input circuit starts to switch the output signal to a second logic level based on the level of the input signal reaching a rising edge adjustable trip point; and a model circuit receiving the input signal for modelling the rising edge adjustable trip point on the falling edge of the input signal and for modelling the falling edge adjustable trip point on the rising edge of the input signal to dynamically and asynchronously adjust the falling and rising edge adjustable trip points.

9. The asynchronous self-adjusting circuit of claim 8 wherein the input circuit includes pairs of complimentary p-channel and n-channel transistors and the model circuit includes pairs of complimentary p-channel and n-channel transistors substantially similar to the pairs of complimentary p-channel and n-channel transistors of the input circuit.

10. The asynchronous self-adjusting circuit of claim 8 wherein the model circuit comprises:

a model input inverter for switching a model inverted signal to a high logic level based on the level of the input signal reaching a model falling edge adjustable trip point and for switching the model inverted signal to a low logic level based on the level of the input signal reaching a model rising edge adjustable trip point; and a model output inverter for inverting the model inverted signal to provide a model output signal.

11. The asynchronous self-adjusting circuit of claim 10 wherein the model inverted signal is provided to the input circuit for adjusting the falling and rising edge adjustable trip points.

12. The asynchronous self-adjusting circuit of claim 10 wherein the model output signal is provided to the model input inverter for adjusting the model falling and rising edge adjustable trip points.

13. The asynchronous self-adjusting circuit of claim 8 wherein the input circuit comprises:

enabling circuitry receiving an enable signal for forcing the output signal to a defined logic state based on the enable signal being at a selected disable state.

14. The asynchronous self adjusting circuit of claim 1 wherein the input circuit includes an input buffer.

15. A method of adjusting trip points in an input circuit comprising the steps of:

receiving an input signal;

providing an output signal which starts to switch to a first logic level based on the level of the input signal reaching a falling edge adjustable trip point and which starts to switch to a second logic level based on the level of the input signal reaching a rising edge adjustable trip point; and dynamically and asynchronously adjusting the falling and rising edge adjustable trip points as a function of a previous value of the input signal.

16. The method of claim 15 wherein the step of dynamically and asynchronously adjusting includes the steps of modelling the rising edge adjustable trip point on the falling edge of the input signal and modelling the falling edge adjustable trip point on the rising edge of the input signal to dynamically and asynchronously adjust the falling and rising edge adjustable trip points.

17. The method of claim 15 wherein the step of providing the output signal includes the steps of:

switching an inverted signal to a high logic level based on the level of the input signal reaching the falling edge adjustable trip point and for switching the inverted signal to a low logic level based on the level of the input signal reaching the rising edge adjustable trip point, and wherein the output signal is a function of the inverted signal.

18. The method of claim 17 wherein the step of dynamically and asynchronously adjusting includes the steps of delaying the inverted signal and adjusting the falling and rising edge adjustable trip points with the delayed inverted signal.

19. A method of adjusting trip points in an input circuit comprising the steps of:

receiving an input signal;

providing an output signal which starts to switch to a first logic level based on the level of the input signal reaching a falling edge adjustable trip point and which starts to switch to a second logic level based on the level of the input signal reaching a rising edge adjustable trip point;

modelling the rising edge adjustable trip point on the falling edge of the input signal and modelling the falling edge adjustable trip point on the rising edge of the input signal; and dynamically and asynchronously adjusting the falling and rising edge adjustable trip points based on the modelled adjustable trip points.

20. The method of claim 19 wherein the step of modelling includes the steps of:

switching a model inverted signal to a high logic level based on the level of the input signal reaching a model falling edge adjustable trip point and switching the model inverted signal to a low logic level based on the level of the input signal reaching a model rising edge adjustable trip point; and inverting the model inverted signal to provide a model output signal.

21. The method of claim 20 wherein the step of dynamically and asynchronously adjusting is performed based on the model inverted signal.

22. The method of claim 20 wherein the step of modelling includes the step of adjusting the model falling and rising edge adjustable trip points with the model output signal.

* * * * *

UNITED STATES PATENT AND TRADEMARK OFFICE
CERTIFICATE OF CORRECTION

PATENT NO. : 5,612,630

DATED : March 18, 1997

INVENTOR(S) : Jeffrey P. Wright and Eugene H. Cloud

It is certified that error appears in the above-identified patent and that said Letters Patent is hereby corrected as shown below:

At Column 12, line 48, please delete "sell-adjusting" and insert --self-adjusting--.

Signed and Sealed this

Twenty-first Day of October 1997

Attest:

BRUCE LEHMAN

Attesting Officer

Commissioner of Patents and Trademarks